United States Patent
Simpson et al.

(10) Patent No.: US 9,730,357 B2
(45) Date of Patent: Aug. 8, 2017

(54) CABLE CONNECTOR MOUNTS FOR CONNECTOR BRICKS OF A CABLE COMMUNICATION SYSTEM

(71) Applicant: Tyco Electronics Corporation, Berwyn, PA (US)

(72) Inventors: Jeffrey Stewart Simpson, Mechanicsburg, PA (US); Christopher Ritter, Hummelstown, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 191 days.

(21) Appl. No.: 14/661,503

(22) Filed: Mar. 18, 2015

(65) Prior Publication Data

US 2016/0276790 A1    Sep. 22, 2016

(51) Int. Cl.
*H05K 7/14* (2006.01)
*H01R 12/91* (2011.01)
*H01R 13/631* (2006.01)

(52) U.S. Cl.
CPC ........... *H05K 7/1492* (2013.01); *H01R 12/91* (2013.01); *H01R 13/6315* (2013.01)

(58) Field of Classification Search
CPC ........ H01R 9/2408; H01R 9/26; H01R 12/91; H01R 13/28; H01R 13/514; H01R 13/518; H01R 13/6315; H05K 7/1492

USPC .............. 439/540.1, 701, 712, 724, 246-248
See application file for complete search history.

(56) References Cited

U.S. PATENT DOCUMENTS

| | | | |
|---|---|---|---|
| 6,352,452 B1 * | 3/2002 | Jimenez | H01R 13/514 439/680 |
| 6,927,974 B2 * | 8/2005 | Robillard | H05K 7/183 361/679.4 |
| 8,845,365 B2 * | 9/2014 | Schroll | H01R 9/034 439/607.27 |
| 9,155,214 B2 * | 10/2015 | Ritter | H04Q 1/06 |
| 9,257,788 B1 * | 2/2016 | Jia | H01R 13/518 |
| 9,312,637 B2 * | 4/2016 | Simpson | H01R 12/91 |
| 9,484,657 B2 * | 11/2016 | Martin | H01R 13/4223 |

* cited by examiner

*Primary Examiner* — Tulsidas C Patel
*Assistant Examiner* — Travis Chambers

(57) ABSTRACT

A connector brick for a cable communication system includes a header frame including end walls and side walls defining a header opening. The header frame is configured for mating with at least one circuit card. A plurality of cable connectors are received in the header opening. Each cable connector has cables extending therefrom and each cable connector has a header holding signal contacts at a mating end of the header and configured for mating with a corresponding card connector of the corresponding circuit card. Cable connector mounts are coupled to the end walls and extend into the header opening. The cable connector mounts engage corresponding cable connectors to secure the cable connectors in the header opening.

20 Claims, 7 Drawing Sheets

CABLE CONNECTOR MOUNTS FOR CONNECTOR BRICKS OF A CABLE COMMUNICATION SYSTEM

BACKGROUND OF THE INVENTION

The subject matter herein relates generally to connector bricks for a cable communication system.

Communication systems, such as network systems, servers, data centers, and the like, use large printed circuit boards, known as backplanes or midplanes, to interconnect circuit cards, such as daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. The cable assemblies need to be held in predetermined locations for mating with line and switch cards. Some known cable communication systems use a cable rack to hold all of the cables and cable connectors of the cable assemblies and a backplane circuit board to precisely locate the cable connectors, guide features and other components for mating with the line and switch cards. However, due to the large number of cable connectors and associated cables, assembly of the cable communication systems is often difficult. For example, cable management of the numerous cables during assembly is difficult. Additionally, securing the cable connectors in the structure of the cable communication system is problematic and time consuming.

A need remains for a cable communication system that may be assembled in an easy and timely manner.

BRIEF DESCRIPTION OF THE INVENTION

In one embodiment, a connector brick for a cable communication system is provided that includes a header frame including end walls and side walls defining a header opening. The header frame is configured for mating with a circuit card. A plurality of cable connectors are received in the header opening. Each cable connector has cables extending therefrom and each cable connector has a header holding signal contacts at a mating end of the header and configured for mating with a corresponding card connector of the circuit card. Cable connector mounts are coupled to the end walls and extend into the header opening. The cable connector mounts engage corresponding cable connectors to secure the cable connectors in the header opening.

In another embodiment, a cable communication system is provided including a chassis having a frame having a plurality of frame members and connector bricks coupled to the frame. Each connector brick includes a header frame coupled to corresponding frame members. The header frame includes end walls and side walls defining a header opening. The header frame is configured for mating with a circuit card. A plurality of cable connectors are received in the header opening. Each cable connector has cables extending therefrom and each cable connector has a header holding signal contacts at a mating end of the header and configured for mating with a corresponding card connector of the circuit card. Cable connector mounts are coupled to the end walls and extend into the header opening. The cable connector mounts engage corresponding cable connectors to secure the cable connectors in the header opening.

DETAILED DESCRIPTION OF THE INVENTION

Figure 1:
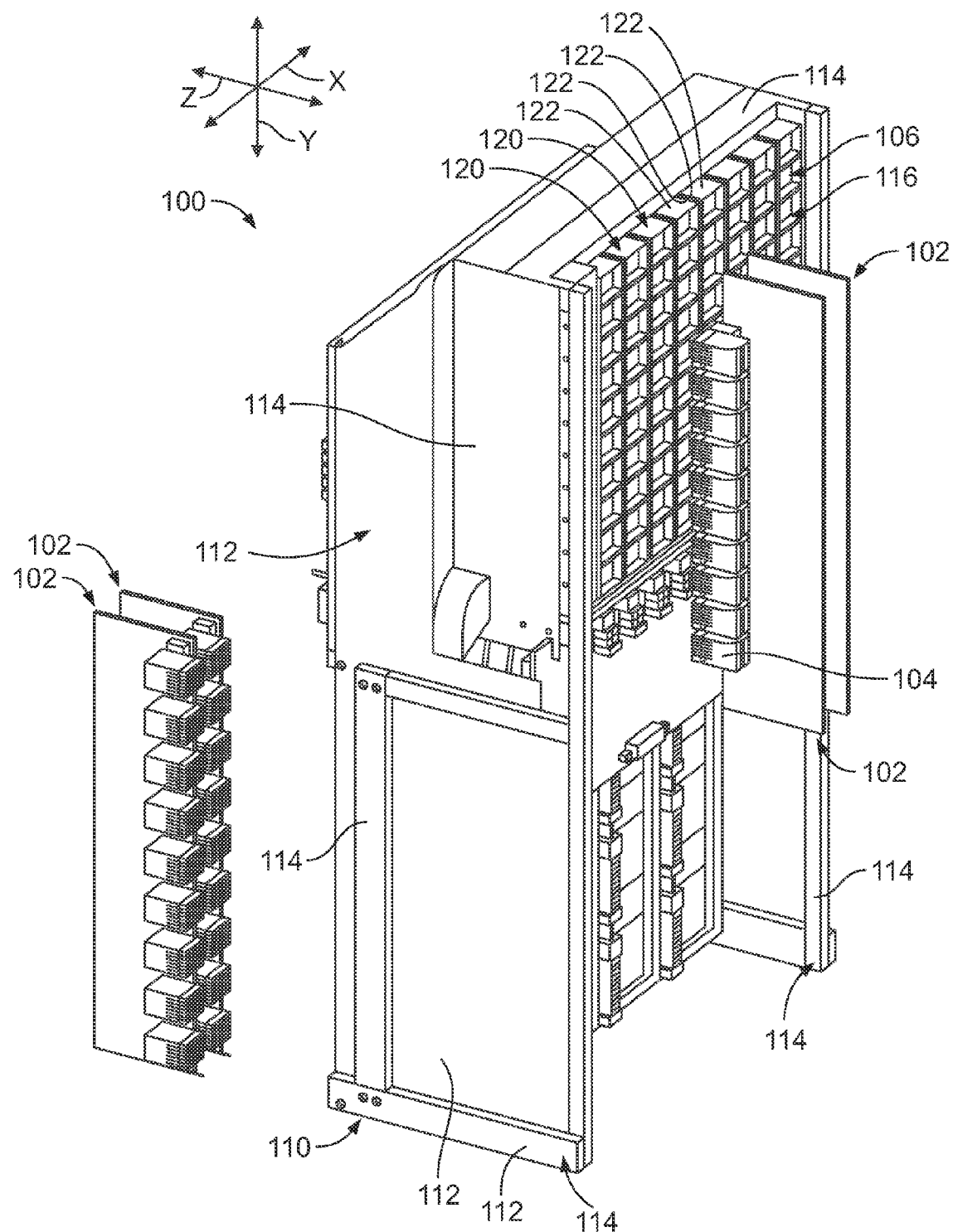
FIG. 1 is a front perspective view of a cable communication system formed in accordance with an exemplary embodiment.

FIG. 1 is a front perspective view of a cable communication system 100 formed in accordance with an exemplary embodiment. The cable communication system 100 is used in a data communication application, such as a network switch. The cable communication system 100 interconnects with circuit cards 102, such as daughtercards, line cards, switch cards, and the like, having card connectors 104. In other embodiments, the cable communication system 100 interconnects with connector or connector assemblies that are cable connectors rather than board mounted connectors. The cable communication system 100 includes a plurality of cable connector assemblies 106 to interconnect the circuit cards 102. The cable communication system 100 may be used to interconnect with other types of connectors and/or cards in other embodiments. The cable communication system 100 may be a backplane system, a midplane system, or another type of communication system.

The cable connector assemblies 106 include cable connectors 116 that are interconnected by cables within the cable communication system 100. The cable connector assemblies 106 eliminate interconnections via traces of a circuit board, such as a backplane circuit board, a midplane circuit board, and the like. The cable connector assemblies 106 have improved signal performance along the signal paths between various connectors of the cable communication system 100 as compared to conventional communication systems. The cable connector assemblies 106 support higher speeds and longer signal path lengths as compared to conventional backplanes or midplanes. The cable connector assemblies 106 provide shielding of signal lines for improved signal performance. The cable connector assemblies 106 are packaged in a structure that allows accurate cable and connector location for mating with the corresponding circuit cards 102. The structure manages and organizes the many cables interconnecting the cable connectors 116. In an exemplary embodiment, the structure is designed for convenient loading of the cable connectors 116 therein using configurable mounting features to secure the cable connectors 116. As such, the cable connectors 116 may be loaded into the structure in any convenient order.

The cable communication system 100 includes a chassis 110 that supports the components of the cable communication system 100. The chassis 110 may include a rack, a cabinet or other suitable structures for holding the components of the cable communication system 100. The chassis 110 may include structures for guiding, supporting and/or securing the circuit cards 102 coupled to the cable communication system 100.

The chassis 110 includes a frame 112 that supports the cable connector assemblies 106 and/or manages the cables of the cable connector assemblies 106. The frame 112 includes a plurality of frame members 114. The frame members 114 may define an open-air cable communication system 100 where the cables are exposed to the external environment. For example, the frame members 114 may be metal support beams or bars forming a rack. In other various embodiments, the frame members 114 may define an enclosed cable communication system 100 where the cables are enclosed in cable channels or raceways. For example, the frame members 114 may include sheet metal pieces forming cable trays to contain the cables. Other types of frame members 114 may be used in various embodiments.

The chassis 110 may include organizer boards or plates coupled to the front and/or rear of the frame 112. The organizer boards may include openings through which one or more of the cable connectors 116 may extend for mating with the circuit cards 102. Optionally, the organizer board may be a circuit board and may be manufactured from typical circuit board material, such as FR-4 material. For example, the organizer board may be a backplane circuit board, a midplane circuit board, and the like. Electrical components, such as power supplies, fans, fixed connectors, and the like may be mechanically and/or electrically connected to the circuit board. Additionally, components on the organizer board may align, mate or otherwise couple to components on the circuit cards 102. Alternatively, the organizer board may be a sheet metal plate having one or more openings. In other various embodiments, the chassis 110 may be provided without an organizer board.

In an exemplary embodiment, the cable connectors 116 are arranged together in groups to form a connector brick 120. The connector bricks 120 are coupled to the frame 112. In various embodiments, the supporting frame or structure of the connector bricks 120 may be coupled to the chassis 110 prior to loading the cable connectors 116 therein. The connector bricks 120 may include mounting features that allow the cable connectors 116 to be mounted in place and may allow mounting the cable connectors 116 in any convenient order during assembly. The connector bricks 120 may be oriented vertically, horizontally or at other orientations or combination of orientations. Each connector brick 120 may be independently movable relative to other connector bricks 120, such as for alignment and mating with the corresponding circuit card 102. Optionally, each connector brick 120 is mated to a different circuit card 102. Each connector brick 120 includes a header frame 122 that holds and supports a plurality of the cable connectors 116. The cables connecting various cable connectors 116 are routed between cable connectors 116 held in different connector bricks 120. Optionally, cables from one cable connector 116 may be routed to different cable connectors 116 held in different connector bricks 120. To ease assembly and routing of the cables between the different cable connectors 116 and different connector bricks 120, the header frames 122 may include mounting features that allow the cable connectors 116 to be mounted to the header frames 122 in any convenient order, such as starting loading of some connector bricks 120 in the middle of the connector bricks 120, starting loading of some connector bricks 120 near one end of the connector bricks 120, starting loading of some connector bricks 120 near the other end of the connector bricks 120, and the like. Optionally, the connector bricks 120 may be connected to the frame members 114 with some freedom of movement or float in the connection to allow the connector bricks 120 to move relative to one another to independently align the connector bricks 120 relative to the frame 112. For example, the header frame 122 may be connected to the frame members 114 using float mechanisms.

The frame 112 holds the connector bricks 120 in rough alignment for mating with the circuit cards 102. Optionally, the connector bricks 120 may have a limited amount of float relative to the frame 112 to allow course alignment of the connector brick 120 with the circuit card 102 during mating. For example, the float mechanisms 124 may allow a limited amount of movement or float in mutually perpendicular X, Y and/or Z directions to allow course alignment of the connector brick 120 with the circuit card 102. Guide features may be provided on the connector brick 120 and on the circuit card 102 that guide mating of the circuit card 102 with the connector brick 120. The cable connectors 116 are moved with the header frame 122 during course alignment and mating with the circuit card 102 such that the cable connectors 116 are positioned within a tolerance for mating with corresponding card connectors 104 of the circuit card 102.

Optionally, each cable connector 116 may have a limited amount of floating movement relative to the corresponding header frame 122 to allow for precise positioning or fine alignment of the cable connector 116 for mating with the corresponding card connector 104. For example, the connection or mounting element between the cable connector 116 and the header frame 122 may allow a limited amount of movement or float in mutually perpendicular X, Y and/or Z directions to allow fine alignment of the cable connector 116 with the corresponding card connector 104 of the circuit card 102. As such, the cable connectors 116 do not need to be precisely positioned prior to mating as the connector brick 120 will provide course alignment and the cable connectors 116 themselves will provide fine alignment during mating.

Figure 2:
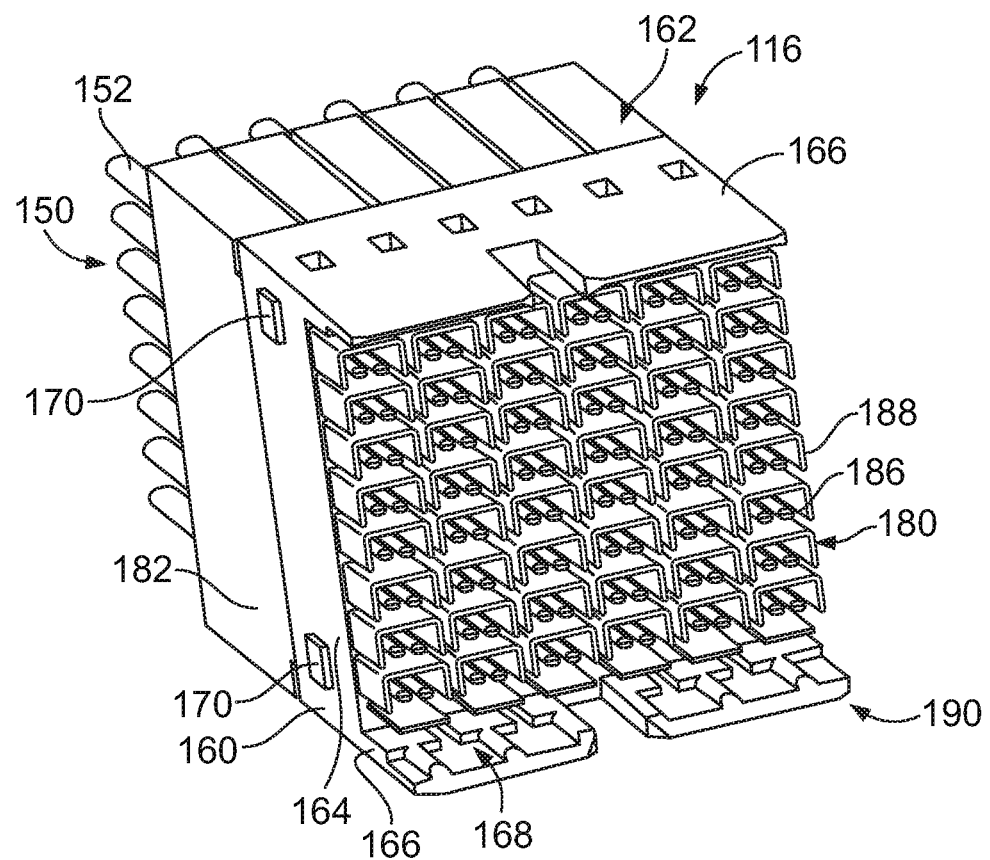
FIG. 2 illustrates a portion of a cable connector assembly of the cable communication system being formed in accordance with an exemplary embodiment.

FIG. 2 illustrates a portion of one cable connector assembly 106 (FIG. 1) formed in accordance with an exemplary embodiment. The cable connector assembly 106 includes one or more cable connectors 116 (only one shown) and a cable bundle 150 connecting the one or more cable connectors 116. Optionally, cables from one cable connector 116 may be routed to multiple, different cable connectors (not shown).

The cable connector 116 is provided at an end of the cable bundle 150. The cable bundle 150 includes a plurality of cables 152. The cables 152 extend to one or more different cable connectors (not shown) that are configured to be mated with different circuit cards. For example, the cable connector 116 may be connected to a first card connector 104 (shown in FIG. 1) of a first circuit card 102 (shown in FIG. 1) and the other cable connector(s) may be connected to card connector(s) of one or more other circuit cards 102.

Optionally, the cable connector 116 may define a header connector. The cable connector 116 is configured to be mated with a corresponding card connector 104, which may be a receptacle connector, such as STRADA Whisper receptacle connector, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs. Optionally, power conductors may be provided in lieu of or in addition to the signal conductors.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header 160 holding a plurality of contact modules 162. The header 160 includes a base wall 164 and shroud walls 166 extending from the base wall 164 to define a mating cavity 168 configured to receive the corresponding card connector 104. The shroud walls 166 guide mating of the card connector 104 with the cable connector 116, such as to provide fine alignment with the card connector 104 during mating. In an exemplary embodiment, the header 160 has lugs 170 extending outward from the base wall 164 and/or the shroud walls 166. The lugs 170 are used to locate the cable connector 116 with respect to the header frame 122 (shown in FIG. 1).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference. The cable assemblies 180 may be provided with greater or fewer signal contacts 186 in alternative embodiments. The cable assemblies 180 may be provided without the ground shields 188 in alternative embodiments. The cable assemblies 180 may be provided with different shaped ground shields 188 in alternative embodiments. The cable assemblies 180 may provide power in lieu of or in addition to the signals. The signal contacts 186 and ground shields 188 are configured to be mated to a corresponding card connector 104 (shown in FIG. 1) at a mating end 190 of the header 160.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield 188 to electrically common the ground shields 188, and a dielectric overmold overmolded around the cables 152 and portions of the metal plate to support the cables 152 and cable assemblies 180. The contact modules 162 may be provided without the support bodies 182 in alternative embodiments.

Multiple contact modules 162 are loaded into the header 160. The header 160 holds the contact modules 162 in parallel such that the cable assemblies 180 are aligned in parallel columns. Any number of contact modules 162 may be held by the header 160 depending on the particular application. When the contact modules 162 are stacked in the header 160, the cable assemblies 180 may also be aligned in rows. Other types of contact modules 162 and/or cable connectors 116 may be provided in alternative embodiments. Optionally, each contact module 162 may be connected to a different cable connector at the opposite end.

Figure 3:
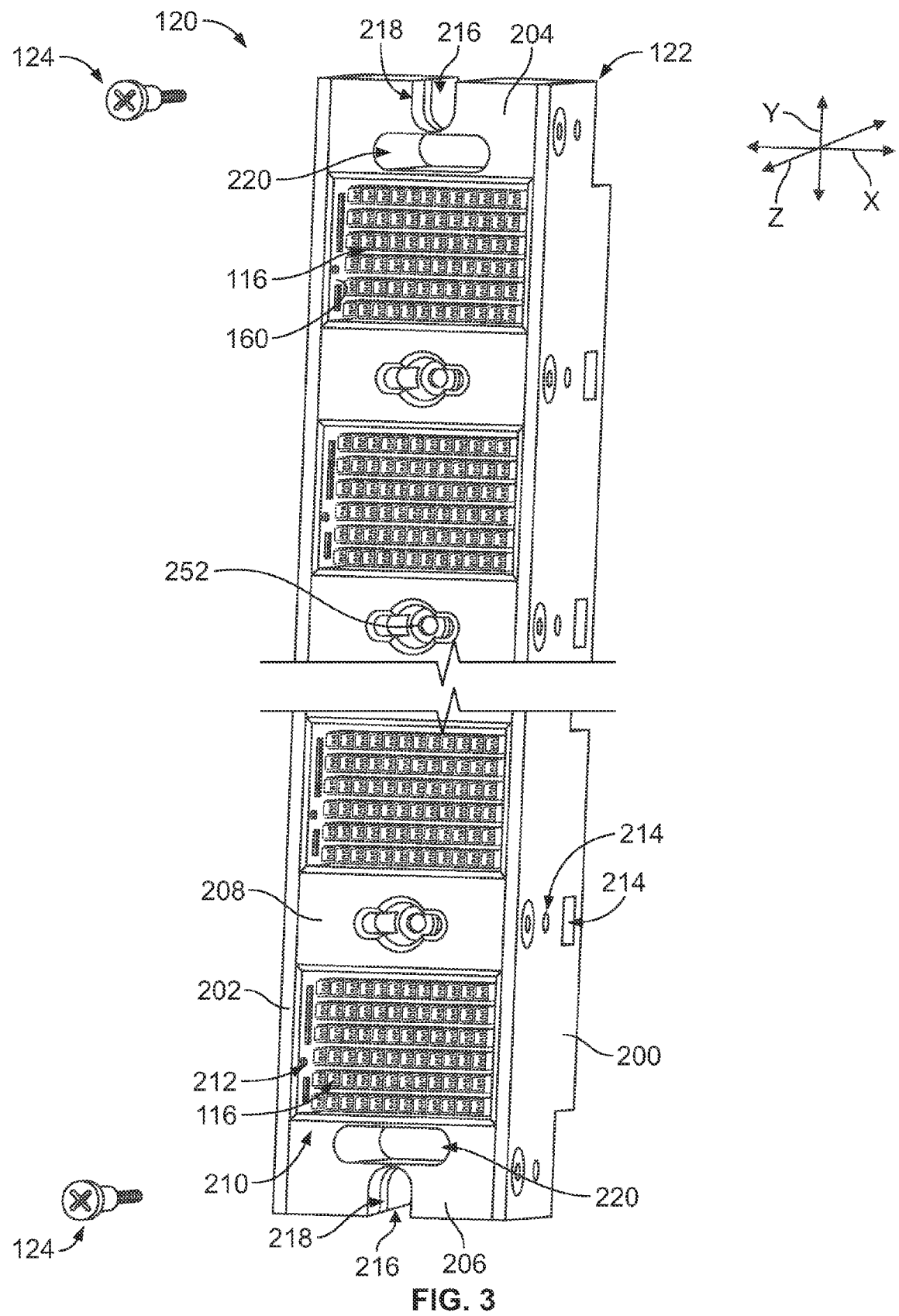
FIG. 3 illustrates a connector brick of the cable communication system being formed in accordance with an exemplary embodiment.

FIG. 3 illustrates one of the connector bricks 120 formed in accordance with an exemplary embodiment. The connector brick 120 includes the header frame 122 that holds the cable connectors 116. In the illustrated embodiment, the header frame 122 include a pair of end walls 200, 202 and a pair of side walls 204, 206 extending between the end walls 200, 202. Optionally, the header frame 122 may include one or more cable connector mounts 208 for securing the cable connectors 116 to the header frame 122. The cable connector mounts 208 may extend between the end walls 200, 202. The header frame 122 has a front end 210 that faces outward, such as away from the cables. The front end 210 may be defined by fronts of the walls 200, 202, 204, 206.

The side walls 204, 206 and cable connector mounts 208 are used to position the cable connectors 116 in the header frame 122 and to secure the cable connectors 116 in position for mating with corresponding card connectors 104 (shown in FIG. 1). The side walls 204, 206 and cable connector mounts 208 may be spacers or blocks positioned between the end walls 200, 202 to control the spacing between the end walls 200, 202. The side walls 204, 206 and cable connector mounts 208 may be metal pieces, plastic pieces, or manufactured from other materials. Optionally, the side walls 204, 206 and cable connector mounts 208 may be multi-piece blocks, such as a front block and a rear block, which may be coupled together during assembly, such as to capture portions of the cable connectors 116 therebetween (for example, the lugs 170). The end walls 200, 202 may be secured to the side walls 204, 206 and cable connector mounts 208, such as by threaded fasteners, latches, and the like.

A header opening 212 is defined between the end walls 200, 202 and the side walls 204, 206. The header opening 212 extends longitudinally along the end walls 200, 202 (for example, in a longitudinal direction defined between the side walls 204, 206) and laterally along the side walls 204, 206 (for example, in a lateral direction defined between the end walls 200, 202). The headers 160 of the cable connectors 116 are received in the header opening 212. The header opening 212 may be sized to receive any number of headers 160, such as by lengthening or shortening the end walls 200, 202. Optionally, the header frame 122 is sized to align the headers 160 in a single row within the header opening 212. For example, the side walls 204, 206 and cable connector mounts 208 control the spacing between the end walls 200, 202 to a single header width. Optionally, the cable connector mounts 208 may be positioned between each of the headers 160.

In an exemplary embodiment, the end walls 200, 202 are generally planar plates having a rectangular shape; however, other shapes are possible in alternative embodiments. The end walls 200, 202 include openings 214 that receive corresponding fasteners or other securing features of the cable connector mounts 208. The end walls 200, 202 may include alignment slots configured to receive portions of the headers 160 to align the headers 160 with the header frame 122. For example, the alignment slots may receive the lugs 170 (shown in FIG. 2) of the headers 160 and may be oversized relative to the lugs 170 to allow a controlled, limited amount of floating movement of the headers 160 relative to the header frame 122. As such, when the connector bricks 120 are held in the frame 112 (shown in FIG. 1), the headers 160 are movable relative to the frame 112, such as for alignment with individual card connectors 104 (shown in FIG. 1). Alternatively, the lugs 170 may be received in elongated alignment slots in the side walls 204, 206 and the cable connector mounts 208 rather than in the end walls 200, 202.

The side walls 204, 206 have mounting slots 216 that receive the float mechanisms 124. The mounting slots 216 may be open at the exterior side of the side walls 204, 206. Alternatively, the mounting slots 216 may be closed. The mounting slots 216 include pockets 218 that receive portions of the float mechanisms 124. For example, the float mechanisms 124 may be shoulder screws and the pockets 218 may receive shoulders of the shoulder screws. The float mechanisms 124 are movable within the mounting slots 216. For example, the mounting slots 216 may be oversized to allow a controlled, limited amount of floating movement of the side walls 204, 206 on the float mechanism 124. The side walls 204, 206 may be movable in mutually perpendicular X, Y and/or Z directions. For example, in the illustrated embodiment, the side walls 204, 206 are movable in X and Y directions, which correspond to movement in the longitudinal direction and the lateral direction.

The side walls 204, 206 have guide features 220, which in the illustrated embodiment are guide openings, which are configured to receive guide pins (not shown) extending from the circuit card 102 (shown in FIG. 1). The guide features 220 are used to guide loading of the connector brick 120 with the circuit card 102.

Figure 4:
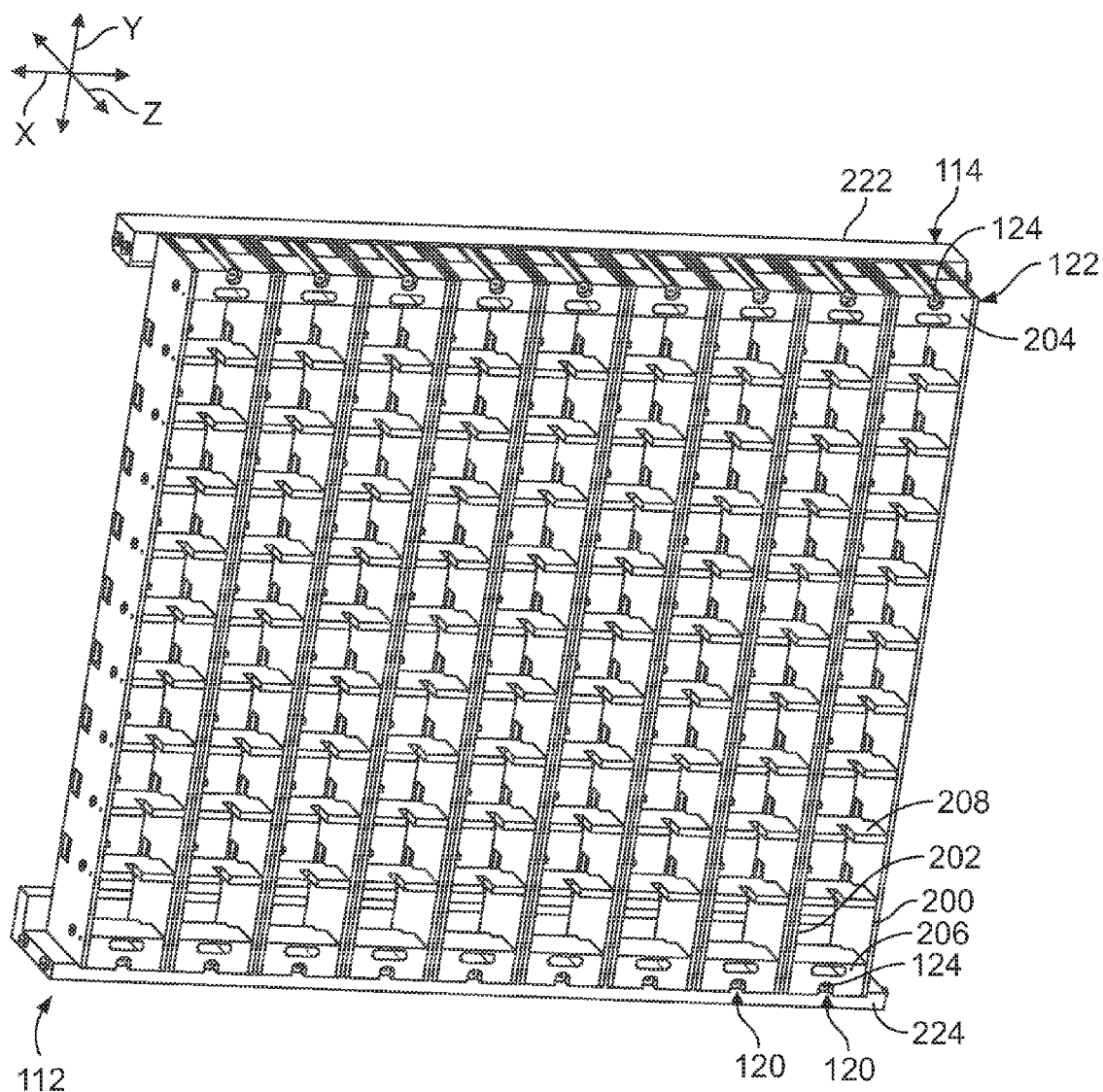
FIG. 4 is a front perspective view of a plurality of the connector bricks coupled to a frame of the cable communication system.

FIG. 4 is a front perspective view a plurality of the connector bricks 120 (with cable connectors 116 (FIG. 2) removed for clarity to illustrate the supporting structure therefore) coupled to the frame 112 using the float mechanisms 124. In an exemplary embodiment, the frame 112 includes upper and lower frame members 222, 224, which may be secured between other frame members 114 (shown in FIG. 1). Each connector brick 120 is assembled by securing the side walls 204, 206 between the end walls 200, 202 using threaded fasteners. The cable connectors 116 (shown in FIG. 1) may be assembled in-situ in the appropriate header frames 122 of the connector bricks 120 after the header frames 122 are coupled to the frame members 222, 224. For example, the cable connector mounts 208 may be used to secure the cable connectors 116 into the header frames 122. The cable connectors 116 may be rear loaded into the header frames 122 and then the cable connector mounts 208 may be secured in place to lock the cable connectors 116 in the header frames 122.

Figure 5:
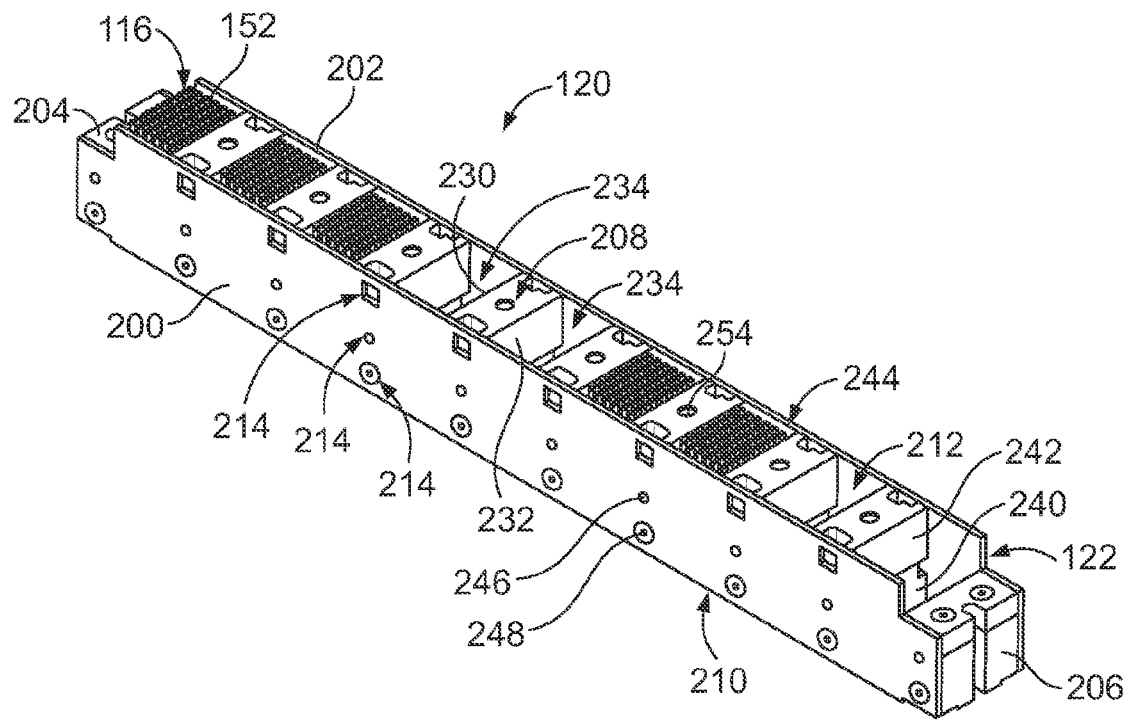
FIG. 5 is a rear perspective view a connector brick formed in accordance with an exemplary embodiment.
Figure 6:
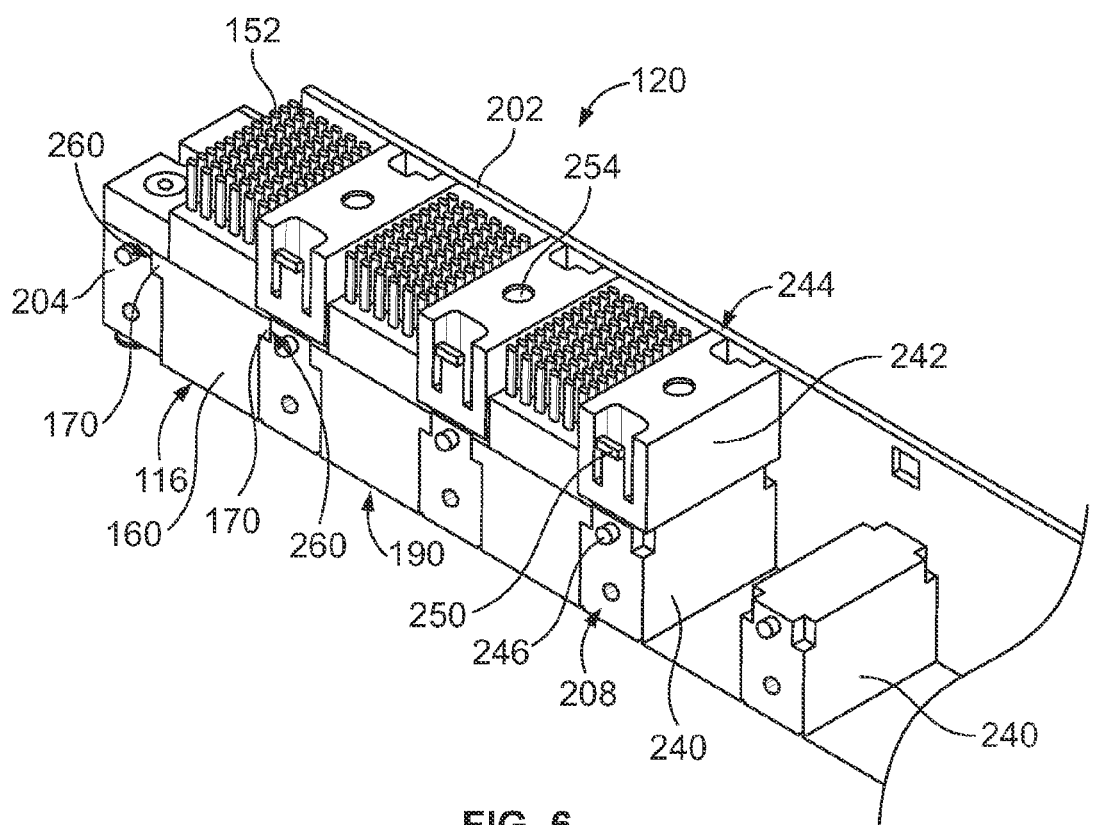
FIG. 6 is a rear perspective view of a portion of the connector brick shown in FIG. 5.

FIG. 5 is a rear perspective view of one of the connector bricks 120 formed in accordance with an exemplary embodiment. FIG. 6 is a rear perspective view of a portion of the connector brick 120 with the end wall 200 (FIG. 5) removed to illustrate the cable connectors 116 and cable connector mounts 208. The cable connector mounts 208 position the cable connectors 116 in the header opening 212. The cable connector mounts 208 secure the cable connectors 116 in the header opening 212.

In an exemplary embodiment, the cable connector mounts 208 are spacers interspersed between successive cable connectors 116. The cable connector mounts 208 may be referred to hereinafter as spacers 208. In the illustrated embodiment, each spacer 208 is used to secure two cable connectors 116 in the header frame 122. For example, one cable connector 116 is provided on a first side 230 of the spacer 208 and another cable connector 116 is provided on an opposite second side 232 of the spacer 208.

The cable connector mounts 208 extend across the header opening 212 between the opposite end walls 200, 202. The cable connector mounts 208 divide the header opening 212 into discrete cable connector channels 234. Each cable connector channel 234 is configured to receive its own cable connector 116 therein. Any load pattern of the cable connectors 116 is possible. For example, some of the cable connector channels 234 may remain empty. Optionally, some of the cable connector channels 234 may be sized differently to receive different types of cable connectors 116. In an exemplary embodiment, the cable connector mounts 208 allow a limited amount of floating movement of the cable connectors 116 in the cable connector channels 234 of the header opening 212, such as for alignment with the corresponding card connectors 104 (shown in FIG. 1) during mating therewith.

In an exemplary embodiment, the spacers 208 are multi-piece spacers. For example, in the illustrated embodiment, each spacer 208 includes a front spacer member 240 and a rear spacer member 242. The front spacer members 240 are positioned at the front end 210 of the header frame 122. The rear spacer members 242 are positioned at a rear end 244 of the header frame 122. The cable connectors 116 may be rear loaded into the cable connector channels 234 through the rear end 244. The cable connectors 116 are held in the header frame 122 such that the mating ends 190 of the headers 160 are provided at or near the front end 210 of the header frame 122. The cables 152 exit the header frame 122 at the rear end 244.

Each front spacer member 240 may be separately secured to the header frame 122. For example, each front spacer member 240 may include posts 246 extending from opposite ends of the front spacer member 240. The posts 246 are configured to be received in corresponding openings 214 in the end walls 200, 202. In an exemplary embodiment, fasteners 248 are used to secure the front spacer members 240 to the end walls 200, 202. For example, the fasteners 248 may pass through corresponding openings 214 in the end walls 200, 202 and may be threadably coupled to the front spacer members 240. The front spacer members 240 may be secured to the end walls 200, 202 using other types of securing features in alternative embodiments.

In an exemplary embodiment, the rear spacer members 242 may be separately coupled to the end walls 200, 202 and/or to the front spacer members 240. The rear spacer members 242 include deflectable latches 250 used to secure the rear spacer members 242 to the end walls 200, 202. For example, the deflectable latches 250 may be received in corresponding openings 214 in the end walls 200, 202 once the rear spacer members 242 are loaded into the header opening 212. The rear spacer members 242 may additionally or alternatively be coupled to the front spacer members 240, such as using threaded fasteners. For example, threaded fasteners 252 (shown in FIG. 3) may pass through the front spacer members 240 and be threadably coupled to threaded inserts 254 in the rear spacer members 242. The rear spacer members 242 may be secured to the end walls 200, 202 and/or the front spacer members 240 using other types of securing features in alternative embodiments.

The rear spacer members 242 are secured to the end walls 200, 202 and/or the front spacer members 240 after the cable connectors 116 are loaded into the header opening 212. For example, the front spacer members 240 may be coupled to the end walls 200, 202 prior to loading the cable connectors 116 into the header opening 212. The front spacer members 240 define portions of the cable connector channels 234 that receive corresponding cable connectors 116. The front spacer members 240 position the cable connectors 116 in the header frame 122 and the rear spacer members 242 are coupled to the header frame 122 to secure the cable connectors 116 in the corresponding cable connector channels 234. Using multi-piece spacers 208 provides easy assembly of the connector brick 120. For example, the cable connectors 116 may be loaded into the header frame 122 in any order and at any time, including after the connector bricks 120 are mounted to the frame 112 (shown in FIG. 4).

Using the deflectable latches 250 allows the rear spacer members 242 to be coupled to the end walls 200, 202 without needing to access the exterior ends of the end walls 200, 202. For example, the rear spacer members 242 may be coupled to the end walls 200, 202 after the connector bricks 120 are positioned in the frame 122. The installer does not need to use threaded fasteners through the end walls 200, 202 to secure the rear spacer members 242 to the end walls 200, 202. The rear spacer members 242 may be snapped into the header frame 122 quickly making overall assembly of the cable connector system 100 easier and less labor intensive.

In an exemplary embodiment, the front spacer members 240 and/or rear spacer members 242 may include pockets 260 sized, shaped, and located to receive corresponding lugs 170 of the headers 160. For example, in the illustrated embodiment, the pockets 260 are provided at the rear of the front spacer members 240. The rear spacer members 242 close the pockets 260 and capture the lugs 170 in the pockets 260. In this manner, the rear spacer members 242 capture the cable connectors 116 in the cable connector channels 234. The rear spacer members 242 block pullout of the cable connectors 116 from the cable connector channels 234. In an exemplary embodiment, the pockets 260 may be slightly oversized to allow a limited amount of floating movement of the cable connectors 116 in the cable connector channels 234. For example, the cable connectors 116 may be able to slightly shift or float longitudinally and/or laterally within the cable connector channels 234.

Figure 7:
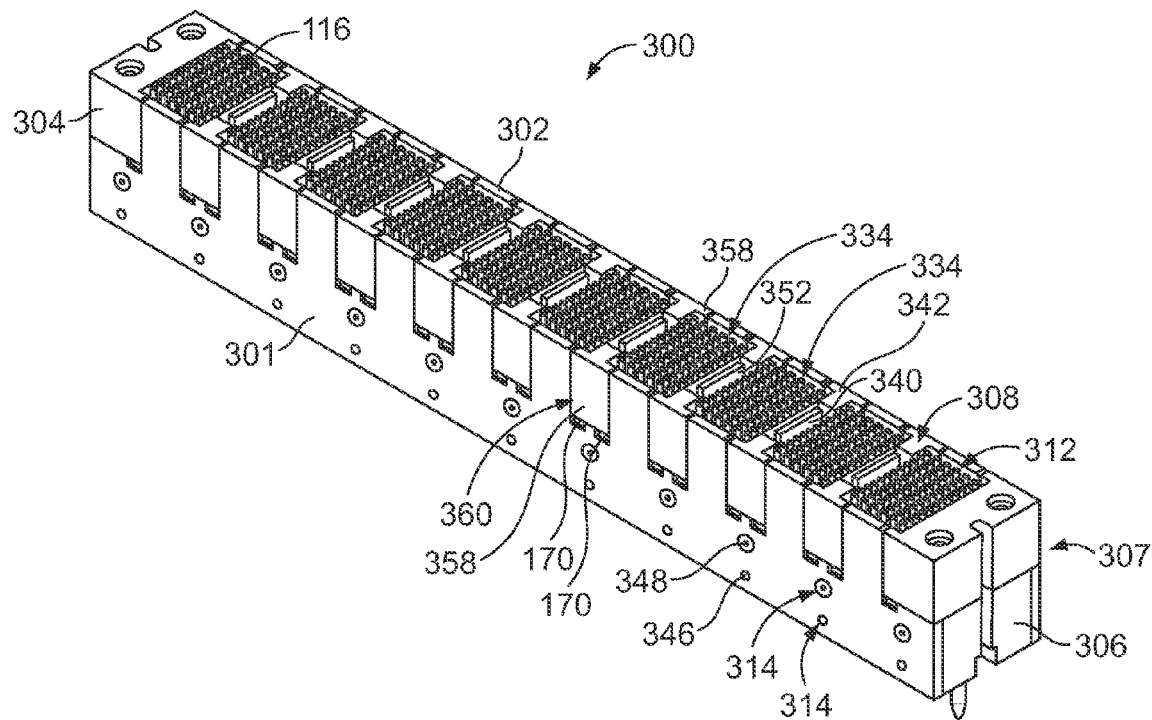
FIG. 7 is a rear perspective view of a connector brick formed in accordance with an exemplary embodiment.
Figure 8:
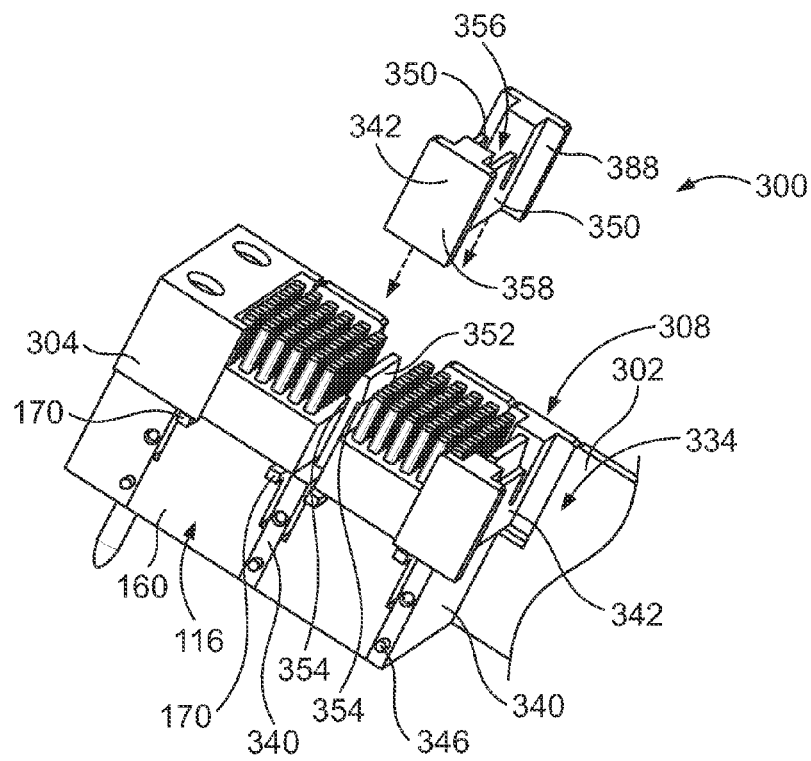
FIG. 8 is a rear perspective view of a portion of the connector brick shown in FIG. 7.

FIG. 7 is a rear perspective view of a connector brick 300 formed in accordance with an exemplary embodiment. FIG. 8 is a rear perspective view of a portion of the connector brick 300. The connector brick 300 is similar to the connector brick 120 except that cable connector mounts of the connector brick 300 attach in a different manner. Accordingly, at least some of the description related to the connector brick 120 is applicable to the connector brick 300.

The connector brick 300 includes end walls 301, 302 and side walls 304, 306 that define a header frame 307. Cable connector mounts 308 are used for securing the cable connectors 116 to the header frame 307. The cable connector mounts 308 may extend between the end walls 301, 302. The cable connector mounts 308 secure the cable connectors 116 in a header opening 312. In an exemplary embodiment, the cable connector mounts 308 are spacers interspersed between successive cable connectors 116. The cable connector mounts 308 divide the header opening 312 into discrete cable connector channels 334. Each cable connector channel 334 is configured to receive its own cable connector 116 therein.

Similar to the cable connector mounts 208 (shown in FIG. 5), the cable connector mounts 308 are multi-piece spacers. For example, in the illustrated embodiment, each cable connector mounts 308 includes a front spacer member 340 and a rear spacer member 342. Each front spacer member 340 may be separately secured to the header frame 307. For example, each front spacer member 340 may include posts 346 extending from opposite ends of the front spacer member 340 received in corresponding openings 314 in the end walls 301, 302. Fasteners 348 may be used to secure the front spacer members 340 to the end walls 301, 302. When the front spacer members 340 are secured to the end walls 301, 302, the front spacer members 340 may form part of the header frame 307 used to support the cable connectors 116.

In an exemplary embodiment, the rear spacer members 342 may be separately coupled to the header frame 307. For example, the rear spacer members 342 may be secured directly to the front spacer members 340, as opposed to the end walls 200, 202 (shown in FIG. 5) as with the rear spacer members 242 (shown in FIG. 5). The rear spacer members 342 include deflectable latches 350 used to secure the rear spacer members 342 to the front spacer members 340. For example, the front spacer members 340 include rear appendages 352 extending rearward therefrom. The rear appendages 352 have one or more shoulders 354 extending therefrom. For example, the shoulders 354 may extend outward from opposite sides of the corresponding appendage 352. The shoulders 354 define catch surfaces for the deflectable latches 350. Optionally, the rear spacer members 342 may have a central slot 356 formed therein with the deflectable latches 350 on opposite sides of the slot 356. The slot 356 receives the corresponding appendage 352 when the rear spacer member 342 is coupled to the front spacer member 340. The rear spacer member 342 is loaded onto the appendage 352 until the deflectable latches 350 latchably engage the shoulders 354. The rear spacer members 342 may additionally or alternatively be coupled to the front spacer members 340, such as using threaded fasteners or other types of securing features in alternative embodiments.

The rear spacer members 342 include end panels 358 at opposite ends thereof. The end panels 358 are received in corresponding pockets 360 in the end walls 301, 302. The rear spacer members 342 are secured to the front spacer members 340 after the cable connectors 116 are loaded into the header opening 312. For example, the front spacer members 340 may be coupled to the end walls 301, 302 prior to loading the cable connectors 116 into the header opening 312. The front spacer members 340 position the cable connectors 116 in the header frame 307 and the rear spacer members 342 are coupled to the header frame 307 to secure the cable connectors 116 in the corresponding cable connector channels 334. Using multi-piece spacers 308 provides easy assembly of the connector brick 300. For example, the cable connectors 116 may be loaded into the header frame 307 in any order and at any time, including after the connector bricks 300 are mounted to the frame 112 (shown in FIG. 4).

In an exemplary embodiment, the pockets 360 are sized, shaped, and located to receive corresponding lugs 170 of the headers 160. It is noted that the lugs 170 in the embodiment shown in FIGS. 7 and 8 extend from different locations than the lugs in the embodiment shown in FIGS. 5 and 6. The end panels 358 of the rear spacer members 342 close the pockets 360 and capture the lugs 170 in the pockets 360. In this manner, the rear spacer members 342 capture the cable connectors 116 in the cable connector channels 334. The rear spacer members 342 block pullout of the cable connectors 116 from the cable connector channels 334. In an exemplary embodiment, the pockets 360 may be slightly oversized to allow a limited amount of floating movement of the cable connectors 116 in the cable connector channels 334. For example, the cable connectors 116 may be able to slightly shift or float longitudinally and/or laterally within the cable connector channels 334.

Figure 9:
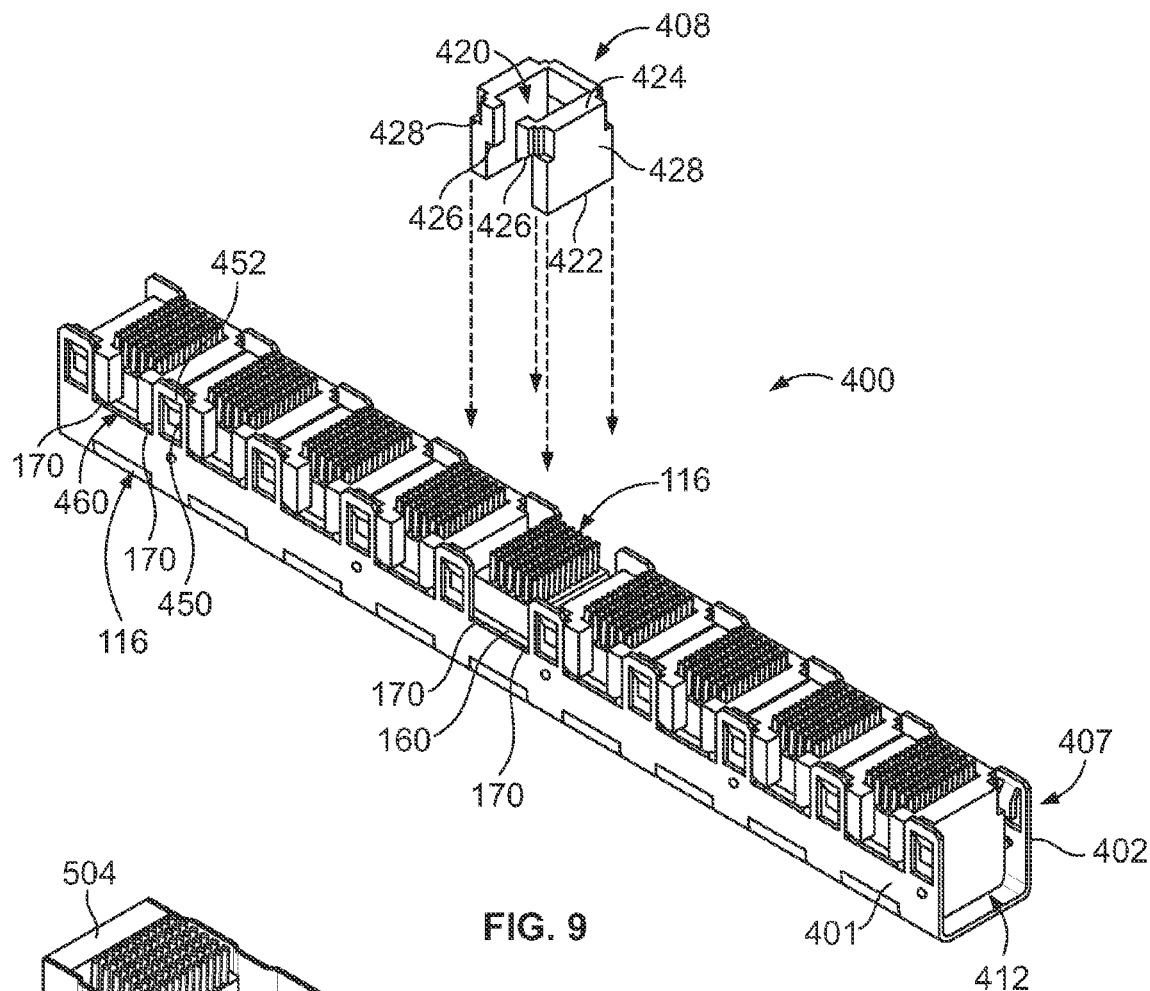
FIG. 9 is a rear perspective view of a connector brick formed in accordance with an exemplary embodiment.

FIG. 9 is a rear perspective view of a connector brick 400 formed in accordance with an exemplary embodiment. The connector brick 400 is similar to the connector brick 120 except that cable connector mounts of the connector brick 400 attach in a different manner. Accordingly, at least some of the description related to the connector brick 120 is applicable to the connector brick 400.

The connector brick 400 includes end walls 401, 402 that define a header frame 407. Optionally, the header frame 407 is a single piece frame that is stamped and formed into a U-shaped profile. The connector brick 400 may include side walls extending between the end walls 401, 402 in alternative embodiments. Cable connector mounts 408 are used for securing the cable connectors 116 to the header frame 407. The cable connector mounts 408 may be loaded into a header opening 412 defined between the end walls 401, 402. The cable connector mounts 408 secure the cable connectors 116 in the header opening 412.

In an exemplary embodiment, the cable connector mounts 408 are sleeves configured to receive and surround corresponding cable connectors 116 to retain the cable connectors 116 in the header frame 407. The sleeves or cable connector mounts 408 have channels 420 that receive the cable connectors 116. The cable connector mounts 408 extend between a front 422 and a rear 424. The cable connector mounts 408 include blocking shoulders 426 that are configured to engage and block the lugs 170 of the headers 160 of the cable connectors 116. The cable connector mounts 408 include latching shoulders 428 that are configured to engage the end walls 401, 402 to latchably secure the cable connector mounts 408 in the header frame 407.

The end walls 401, 402 include deflectable latches 450 used to secure the cable connector mounts 408 in the header opening 412. The deflectable latches 450 are configured to engage the latching shoulders 428 to secure the cable connector mounts 408 in the header opening 412. Optionally, the deflectable latches 450 may engage the latching shoulders 428 of two adjacent cable connector mounts 408 such that the deflectable latch 450 secures both cable connector mounts 408 in the header opening 412. The deflectable latches 450 may be stamped from appendages 452 of the end walls 401, 402.

During assembly, the cable connectors 116 are loaded into the header opening 412 until the lugs 170 are received in pockets 460 defined between the appendages 452. The cable connector mounts 408 may then be loaded over the rear ends of the cable connectors 116 such that the cable connectors 116 are received in the channels 420 of the cable connector mounts 408. The cable connector mounts 408 are loaded into the header opening 412 until the deflectable latches 450 latchably engage the latching shoulders 428 to retain the cable connector mounts 408 in the header opening 412.

Once retained, the blocking shoulders 426 are in blocking positions behind the lugs 170. The blocking shoulders 426 capture the lugs 170 in the pockets 460. In this manner, the cable connector mounts 408 capture the cable connectors 116 in the header opening 412. The cable connector mounts 408 block pullout of the cable connectors 116 from the header opening 412. In an exemplary embodiment, the pockets 460 may be slightly oversized to allow a limited amount of floating movement of the cable connectors 116 in the header frame 407. For example, the cable connectors 116 may be able to slightly shift or float longitudinally and/or laterally within the header opening 412. The cable connector mounts 408 may likewise shift or float with the cable connectors 116. Alternatively, the cable connectors 116 may shift or float within the cable connector mounts 408.

Figure 10:
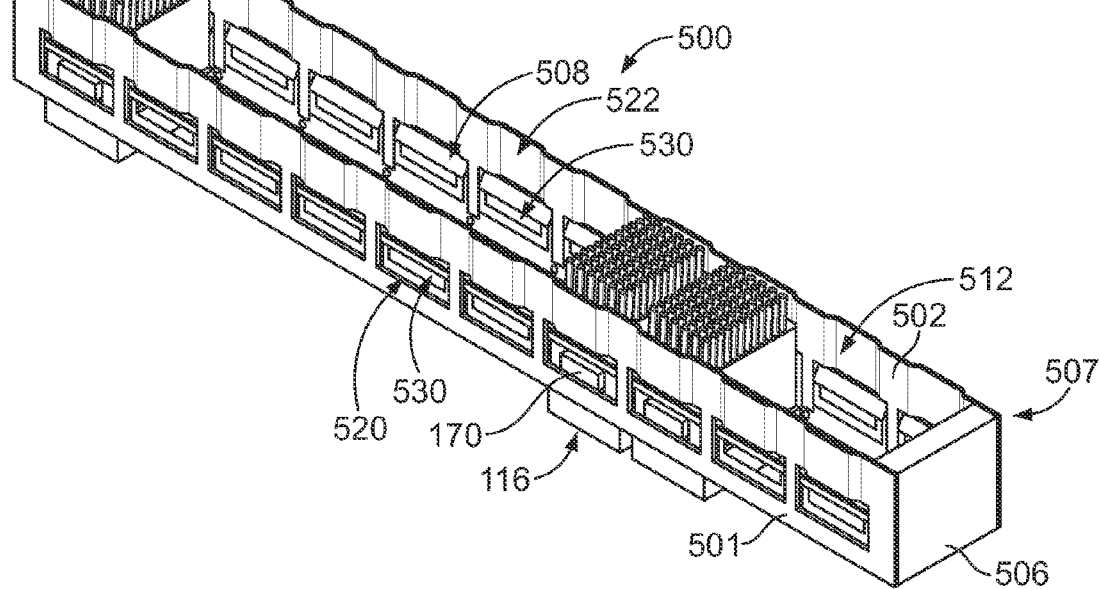
FIG. 10 is a rear perspective view of a connector brick formed in accordance with an exemplary embodiment.

FIG. 10 is a rear perspective view of a connector brick 500 formed in accordance with an exemplary embodiment. The connector brick 500 is similar to the connector brick 120 except that cable connector mounts of the connector brick 500 attach in a different manner. Accordingly, at least some of the description related to the connector brick 120 is applicable to the connector brick 500.

The connector brick 500 includes end walls 501, 502 and side walls 504, 506 that define a header frame 507. Optionally, the end walls 501, 502 may be stamped and formed plates. Cable connector mounts 508 are used for securing the cable connectors 116 to the header frame 507. The cable connector mounts 508 may be defined by inner plates coupled to the outer plates defined by the end walls 501, 502. Optionally, multiple cable connector mounts 508 may be formed from the same inner plate. Alternatively, the cable connector mounts 508 may be discrete plates mounted to the end walls 501, 502. The cable connector mounts 508 secure the cable connectors 116 in a header opening 512 defined between the end walls 501, 502 and side walls 504, 506.

In an exemplary embodiment, the cable connector mounts 508 are deflectable latches that engage the lugs 170 of the cable connectors 116. The cable connector mounts 508 may be deflected between latched and unlatched positions. In the latched positions, the cable connector mounts 508 latchably secure the cable connectors 116 in the header opening 512. In an exemplary embodiment, the end walls 501, 502 includes openings 520 therethrough aligned with the cable connector mounts 508. The cable connector mounts 508 may be deflected outward to the unlatched positions into the openings 520 when the cable connectors 116 are loaded into the header frame 507 until the cable connector mounts 508 snap back into the latched positions, such as after the lugs 170 clear the cable connector mounts 508. The end walls 501, 502 may include pockets 522 above the cable connector mounts 508 that receive the lugs 170 as the cable connectors 116 are loaded into the header frame 507. The pockets 522 may be defined by undulations along the end walls 501, 502.

The cable connector mounts 508 capture the cable connectors 116 in the header opening 512 to block pullout of the cable connectors 116 from the header opening 512. For example, the cable connector mounts 508 have slots 530 that receive the lugs 170. In an exemplary embodiment, the slots 530 may be slightly oversized to allow a limited amount of floating movement of the cable connectors 116 in the header frame 507. For example, the cable connectors 116 may be able to slightly shift or float longitudinally and/or laterally within the header opening 512.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A connector brick for a cable communication system comprising:
    a header frame including end walls and side walls defining a header opening, the header frame being configured for mating with at least one circuit card;
    a plurality of cable connectors received in the header opening, each cable connector having cables extending therefrom, each cable connector having a header holding signal contacts at a mating end of the header and configured for mating with a corresponding card connector of the corresponding circuit card, each header having lugs extending therefrom; and
    cable connector mounts coupled to the end walls and extending into the header opening, the cable connector mounts being interspersed between successive cable connectors and engaging corresponding cable connectors to secure the cable connectors in the header opening, each cable connector mount comprising a front spacer member at a front end of the header frame and a rear spacer member discrete from the front spacer member and located at a rear end of the header frame, the lugs of corresponding headers being captured between and engaging the front spacer members and the rear spacer members to secure the cable connectors in the header opening.

2. The connector brick of claim 1, wherein the cable connector mounts allow a limited amount of floating movement of the cable connectors in the header opening for alignment with the corresponding card connectors during mating.

3. The connector brick of claim 1, wherein the cable connector mounts extend across the header opening between the opposite end walls.

4. The connector brick of claim 1, wherein the cable connector mounts are spacers interspersed between successive cable connectors, each spacer securing two cable connectors with one cable connector on a first side of the spacer and another cable connector on an opposite second side of the spacer.

5. The connector brick of claim 1, wherein the front spacer members include engagement surfaces engaging the corresponding lugs and the rear spacer members include engagement surfaces engaging the corresponding lugs to capture the lugs between the corresponding engagement surfaces of the front spacer members and the corresponding engagement surfaces of the rear spacer members to secure the cable connectors in the header opening.

6. The connector brick of claim 1, wherein the cable connector mounts includes pockets being defined between the front spacer members and the rear spacer members, the lugs being received in corresponding pockets to capture the headers between the front spacer members and the rear spacer members.

7. The connector brick of claim 1, wherein the rear spacer members include latches, the rear spacer members being coupled to the end walls by the latches after the cable connectors are positioned between corresponding front spacer members.

8. The connector brick of claim 1, wherein the rear spacer members include latches, the rear spacer members being coupled to the front spacer members by the latches after the cable connectors are positioned between corresponding front spacer members.

9. The connector brick of claim 1, wherein the cable connector mounts comprise deflectable latches coupled to the end walls, the deflectable latches engaging the headers to secure the cable connectors in the header opening.

10. The connector brick of claim 1, wherein the cable connectors are configured to be loaded into the header opening in any order with the cable connector mounts securing the cable connectors in the header opening irrespective of the order in which the cable connectors are loaded into the header opening.

11. A connector brick for a cable communication system comprising:
    a header frame including end walls and side walls defining a header opening, the header frame being configured for mating with at least one circuit card;
    a plurality of cable connectors received in the header opening, each cable connector having cables extending therefrom, each cable connector having a header holding signal contacts at a mating end of the header and configured for mating with a corresponding card connector of the corresponding circuit card; and
    cable connector mounts coupled to the end walls and extending into the header opening, the cable connector mounts engaging corresponding cable connectors to secure the cable connectors in the header opening, wherein the cable connector mounts are sleeves having channels receiving corresponding cable connectors such that the sleeves surround the cable connectors, the sleeves being secured to the end walls to secure the cable connectors in the header opening.

12. The connector brick of claim 11, wherein the end walls comprise deflectable latches configured to engage corresponding sleeves to secure the sleeves in the header opening.

13. A cable communication system comprising:
    a chassis having a frame having a plurality of frame members; and
    connector bricks coupled to the frame, each connector brick comprising:
    a header frame coupled to corresponding frame members, the header frame including end walls and side walls defining a header opening, the header frame being configured for mating with at least one circuit card;
    a plurality of cable connectors received in the header opening, each cable connector having cables extending therefrom, each cable connector having a header holding signal contacts at a mating end of the header and configured for mating with a corresponding card connector of the corresponding circuit card; and cable connector mounts coupled to the end walls and extending into the header opening, the cable connector mounts being interspersed between successive cable connectors and engaging corresponding cable connectors to secure the cable connectors in the header opening, each cable connector mount comprising a front spacer member and a rear spacer member discrete from the front spacer member, the front spacer member being fixedly coupled to the header frame at a front end of the header frame, the rear spacer member being fixedly coupled to the header frame at a rear end of the header frame.

14. The cable communication system of claim 13, wherein the cable connector mounts extend across the header opening between the opposite end walls.

15. The cable communication system of claim 13, wherein the headers engage both the front spacer members and the rear spacer members of the corresponding cable connector mounts such that the headers are captured between the front spacer members and the rear spacer members to secure the cable connectors in the header opening.

16. The cable communication system of claim 13, wherein the headers include lugs extending therefrom, pockets being defined between the front spacer members and the rear spacer members, the lugs being received in corresponding pockets to capture the headers between the front spacer members and the rear spacer members.

17. The cable communication system of claim 13, wherein the rear spacer members include deflectable latches, the rear spacer members being coupled to the end walls by the latches after the cable connectors are positioned between corresponding front spacer members.

18. The cable communication system of claim 13, wherein the rear spacer members include latches, the rear spacer members being coupled to the front spacer members by the latches after the cable connectors are positioned between corresponding front spacer members.

19. The cable communication system of claim 13, wherein the cable connector mounts are sleeves having channels receiving corresponding cable connectors such that the sleeves surround the cable connectors, the end walls comprising deflectable latches configured to engage corresponding sleeves to secure the sleeves in the header opening.

20. The cable communication system of claim 13, wherein the cable connector mounts comprise deflectable latches coupled to the end walls, the deflectable latches engaging the headers to secure the cable connectors in the header opening.

* * * * *